(12) United States Patent
Hopper et al.

(10) Patent No.: US 9,841,529 B2
(45) Date of Patent: Dec. 12, 2017

(54) NUCLEAR MAGNETIC RESONANCE TOOL WITH EXTERNAL MAGNETS

(75) Inventors: Timothy Hopper, Subiaco, WA (US); David T. Oliver, Sugar Land, TX (US); Anatoly Dementyev, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 911 days.

(21) Appl. No.: 13/885,453

(22) PCT Filed: Nov. 16, 2011

(86) PCT No.: PCT/US2011/060940
§ 371 (c)(1),
(2), (4) Date: Jul. 29, 2013

(87) PCT Pub. No.: WO2012/068219
PCT Pub. Date: May 24, 2012

(65) Prior Publication Data
US 2015/0035529 A1    Feb. 5, 2015

Related U.S. Application Data

(60) Provisional application No. 61/415,407, filed on Nov. 19, 2010, provisional application No. 61/418,172, (Continued)

(51) Int. Cl.
*G01V 3/32* (2006.01)
*E21B 47/00* (2012.01)
*G01R 33/38* (2006.01)

(52) U.S. Cl.
CPC ............... *G01V 3/32* (2013.01); *E21B 47/00* (2013.01); *G01R 33/3808* (2013.01)

(58) Field of Classification Search
CPC ........ G01V 3/32; E21B 47/00; G01R 33/3808
See application file for complete search history.

(56) References Cited

U.S. PATENT DOCUMENTS

| 5,629,623 A | 5/1997 | Sezginer et al. |
| 5,705,927 A * | 1/1998 | Sezginer ............... G01N 24/081 324/303 |

(Continued)

FOREIGN PATENT DOCUMENTS

| EP | 0977057 A2 | 2/2000 |
| EP | 1255128 A1 | 11/2002 |

(Continued)

OTHER PUBLICATIONS

International Search Report for PCT Application Serial No. PCT/US2011/060940 dated Jun. 29, 2012.

(Continued)

*Primary Examiner* — G. M. Hyder

(57) ABSTRACT

Methods and systems are provided that enable logging while drilling NMR measurements to be made with magnets placed outside of the drill collar and magnetically permeable members to control the magnetic field gradient. A set of magnets can be disposed on and/or embedded on a drill collar, with an antenna disposed axially therebetween. Alternatively, a set of magnets and an antenna disposed therebetween can be disposed on a sleeve that is slid onto a recess in a drill collar. Additionally, a permeable member can be axially positioned between the set of magnets for affecting the depth of investigation.

8 Claims, 14 Drawing Sheets

Related U.S. Application Data filed on Nov. 30, 2010, provisional application No. 61/488,265, filed on May 20, 2011.

(56) References Cited

U.S. PATENT DOCUMENTS

| | | |
|---|---|---|
| 6,232,778 B1 | 5/2001 | Speier et al. |
| 6,246,236 B1 | 6/2001 | Poitzsch et al. |
| 6,268,726 B1 | 7/2001 | Prammer et al. |
| 6,362,619 B2 | 3/2002 | Prammer et al. |
| 6,392,410 B2 | 5/2002 | Luong et al. |
| 6,400,149 B1 | 6/2002 | Luong et al. |
| 6,583,621 B2 | 6/2003 | Prammer et al. |
| 6,825,659 B2 | 11/2004 | Prammer et al. |
| 6,838,876 B2 | 1/2005 | Kruspe et al. |
| 7,436,184 B2 | 10/2008 | Moore |
| 8,570,042 B2 | 10/2013 | Pines et al. |
| 8,860,413 B2 | 10/2014 | Hopper et al. |
| 2006/0208738 A1 | 9/2006 | Moore et al. |
| 2010/0244828 A1 | 9/2010 | Pines et al. |

FOREIGN PATENT DOCUMENTS

| | | |
|---|---|---|
| RU | 2230345 C1 | 6/2004 |
| RU | 2273868 C2 | 4/2006 |
| WO | 9210768 A1 | 6/1992 |
| WO | 03071301 A1 | 8/2003 |

OTHER PUBLICATIONS

Decision of Grant issued in RU2013127645 on Feb. 20, 2015, 5 pages.
First Office Action issued in CN201180063168.1 on Apr. 30, 2015, 17 pages.
Office Action issued in MX/A/2013/005580 on May 22, 2015, 5 pages.
Office Action issued in MX/A/2013/005580 on Sep. 24, 2015, 9 pages.
Russian Office Action for Russian Application No. 2013127645 dated Feb. 3, 2014.
Second Office Action issued in CN201180063168.1 on Dec. 2, 2015, 13 pages.
Written Opinion of the International Searching Authority issued in International Application PCT/US2011/060940 dated Jun. 29, 2012. 5 pages.
International Preliminary Report on Patentability issued in International Application PCT/US2011/060940 dated May 30, 2013. 7 pages.
Third Office Action issued in Chinese patent application 201180063168.1 dated May 23, 2016. 6 pages.
Non-final Office Action issued in U.S. Appl. No. 13/288,508, dated Dec. 20, 2013. 5 pages.

* cited by examiner

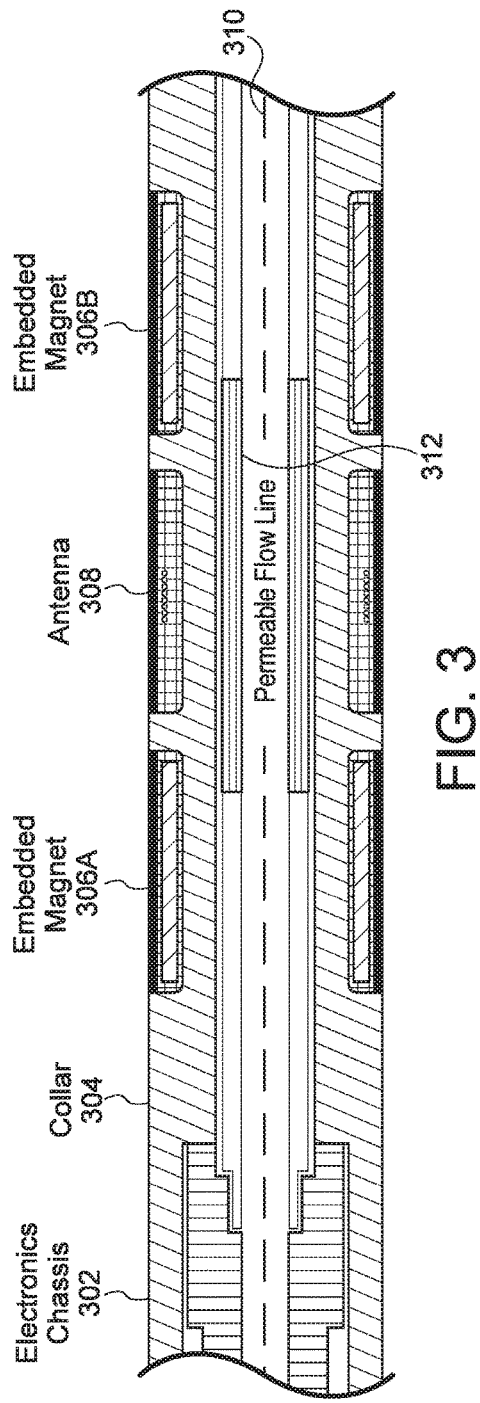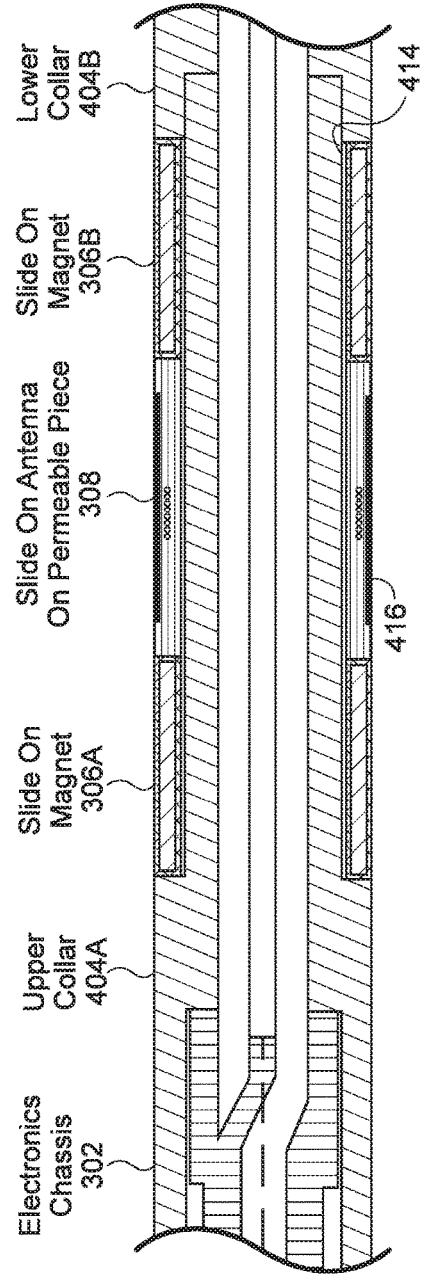

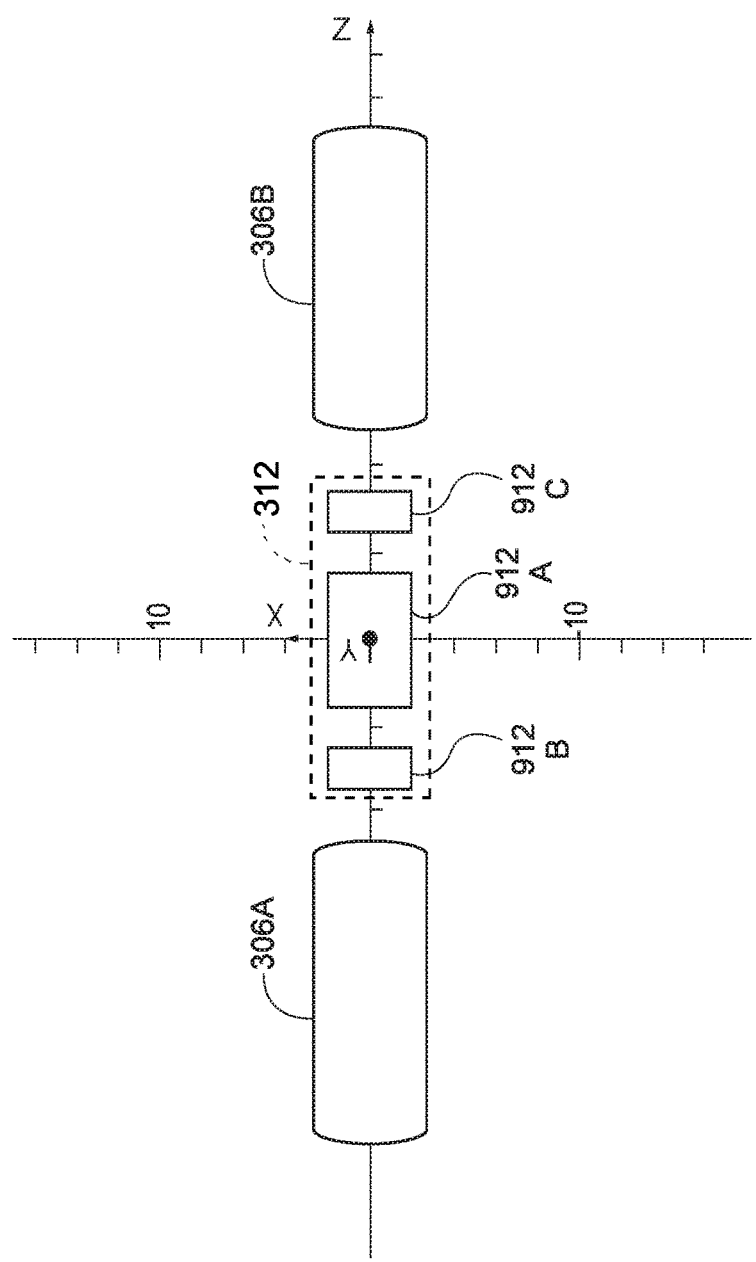

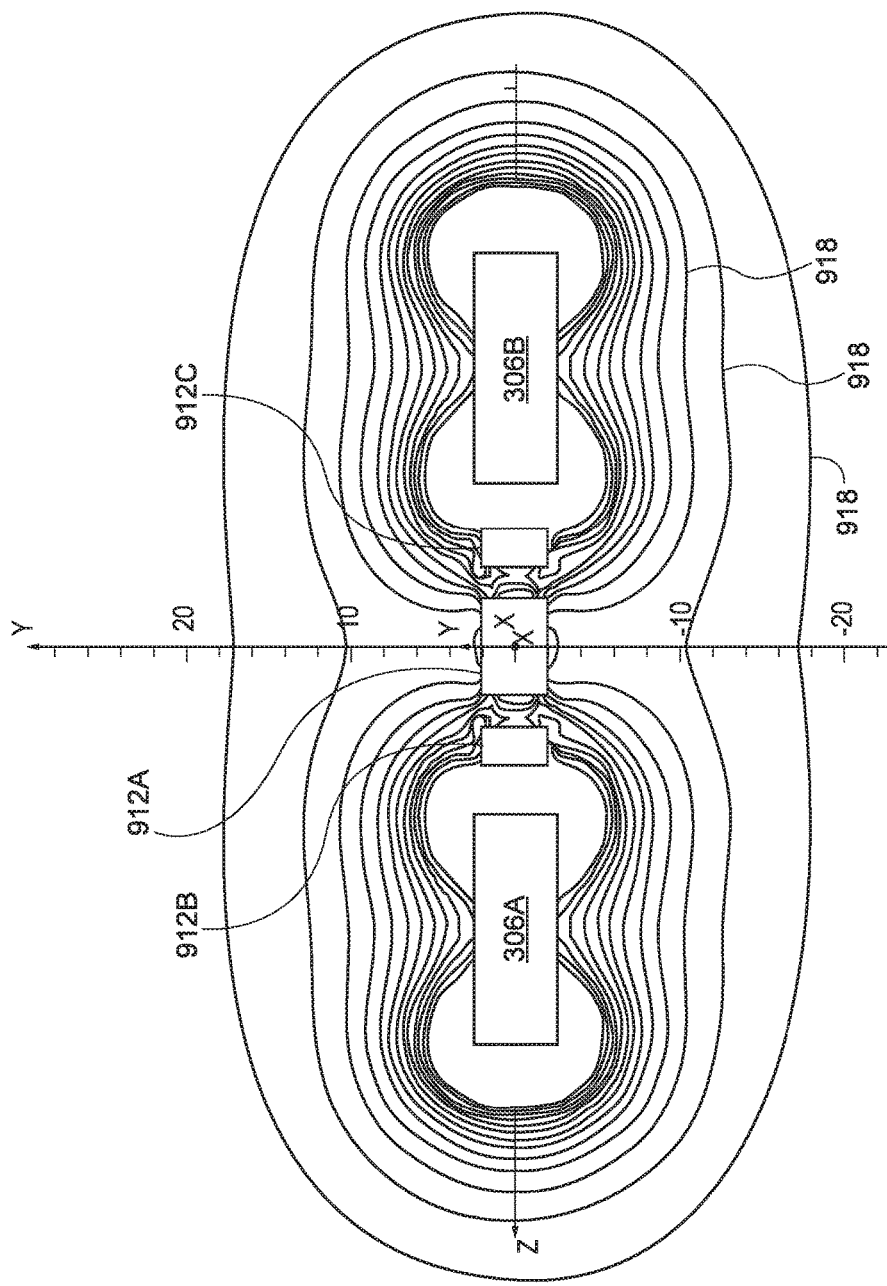

NUCLEAR MAGNETIC RESONANCE TOOL WITH EXTERNAL MAGNETS

CROSS-REFERENCE TO RELATED APPLICATIONS

This application claims priority to U.S. Provisional Patent Application No. 61/415407, titled "NUCLEAR MAGNETIC RESONANCE TOOL WITH EXTERNAL MAGNETS," filed on Nov. 19, 2010; No. 61/418172 , titled "NUCLEAR MAGNETIC RESONANCE TOOL WITH MOVABLE MAGNETS," filed on Nov. 29, 2010; and No. 61/488265, titled "NUCLEAR MAGNETIC RESONANCE TOOL WITH EXTERNAL MAGNETS," filed on May 20, 2011, the entire disclosures of which are hereby incorporated by reference herein.

STATEMENT REGARDING FEDERALLY SPONSORED RESEARCH OR DEVELOPMENT

Not applicable.

BACKGROUND OF THE INVENTION

Field of the Invention

The invention relates generally to the field of nuclear magnetic resonance tools. More specifically, the invention relates to logging-while-drilling nuclear magnetic resonance tools having magnets external to the drill collar and magnetically permeable members to control the magnetic field gradient.

Background Art

Nuclear magnetic resonance (NMR) can be used to determine various characteristics of subsurface formations and/or samples. NMR logging tools can be used downhole to obtain these characteristics, which then can be used to assist in the determination of, for example, the presence, absence, and/or location of hydrocarbons in a given formation or sample.

Conventional NMR logging, well known in the art, generally involves deploying in a wellbore an NMR instrument, which uses magnetic fields to generate and detect various RF signals from nuclei in a formation or sample. Certain example NMR techniques are described in U.S. Pat. No. 6,232,778 assigned to Schlumberger Technology Corp., the entire disclosure of which is hereby incorporated by reference.

NMR measurements, in general, are accomplished by causing the magnetic moments of nuclei in a formation to precess about an axis. The axis about which the nuclei precess may be established by applying a strong, polarizing, static magnetic field $B_0$ to the formation, such as through the use of permanent magnets.

In conventional logging-while-drilling (LWD) NMR tools, these permanent magnets are generally placed within the drill collar, which provides a protective housing for the magnets and other components of the NMR tools. Such protection may be helpful to reduce the risk of damage from drilling, both in terms of shock and wear. Such conventional tools can involve the building of the magnets into a housing to provide a framework for the magnets to be attached thereto. This framework can decrease the volume of magnetic material that can be used. This is critical for NMR, as the Signal to Noise Ratio (SNR) changes as a function of magnetic field strength and the magnetic field gradient. Other disadvantages, such as cumbersome accessibility of the magnets and other NMR tool components, also exist with conventional LWD systems that place the NMR magnet assemblies within the drill collar.

Accordingly, there is a need in the art for methods and systems for obtaining NMR measurements that overcome one or more of the deficiencies that exist with conventional methods.

SUMMARY OF THE INVENTION

In one aspect, a nuclear magnetic resonance apparatus is provided. The apparatus can include a drill collar, a first magnet embedded in the drill collar, a second magnet axially separated from the first magnet, and an antenna disposed between the first magnet and second magnet.

In another aspect, a nuclear magnetic resonance apparatus is provided. The apparatus can include a drill collar having a recess, a sleeve configured to slide onto the recess, a first magnet disposed on the sleeve, a second magnet disposed on the sleeve, and an antenna disposed between the first magnet and second magnet.

Other aspects and advantages of the invention will be apparent from the following description and the appended claims.

BRIEF DESCRIPTION OF THE DRAWINGS

FIG. 3 is a schematic diagram illustrating magnets embedded on a drill collar, according to an example embodiment.

FIG. 4 is a schematic diagram illustrating magnets and an antenna on sleeve disposed on a drill collar, according to an example embodiment.

FIG. 9A illustrates a magnetically permeable member split into rings disposed between two magnets, according to an example embodiment.

FIG. 9C is a chart illustrating magnetic isopotential lines of the magnet assembly of FIG. 9A, according to an example embodiment.

DETAILED DESCRIPTION

The invention provides systems and methods that enable logging while drilling NMR measurements to be made with magnets placed outside of the drill collar and magnetically permeable members to control the magnetic field gradient. Various example methods and systems will now be described with reference to FIGS. 1-10, which depict representative or illustrative embodiments of the invention.

Figure 1:
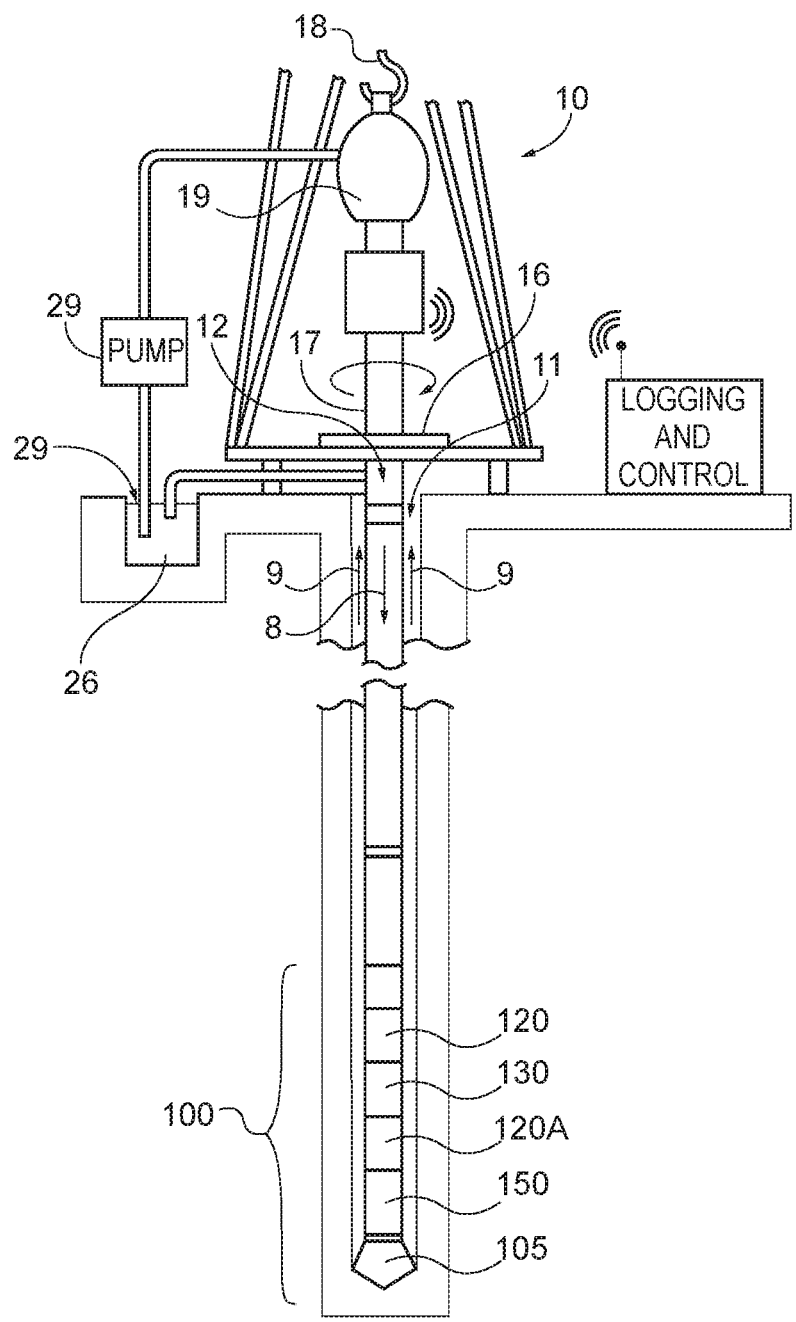
FIG. 1 illustrates a wellsite system in which the present invention can be employed, according to an example embodiment.

FIG. 1 illustrates a wellsite system in which the present invention can be employed, according to an example embodiment. The wellsite can be onshore or offshore. In this example system, a borehole 11 is formed in subsurface formations 106 by rotary drilling in a manner that is well known. Embodiments of the invention can also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole 11, the assembly 10 including a rotary table 16, kelly 17, hook 18 and rotary swivel 19. The drill string 12 is rotated by the rotary table 16, energized by means not shown, which engages the kelly 17 at the upper end of the drill string. The drill string 12 is suspended from a hook 18, attached to a travelling block (also not shown), through the kelly 17 and a rotary swivel 19 which permits rotation of the drill string relative to the hook. As is well known, a top drive system could alternatively be used.

In the example of this embodiment, the surface system further includes drilling fluid or mud 26 stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole 11, as indicated by the directional arrows 9. In this well known manner, the drilling fluid lubricates the drill bit 105 and carries formation 106 cuttings up to the surface as it is returned to the pit 27 for recirculation.

In various embodiments, the systems and methods disclosed herein can be used with any means of conveyance known to those of ordinary skill in the art. For example, the systems and methods disclosed herein can be used with an NMR tool conveyed by wireline, slickline, drill pipe conveyance, and/or a while-drilling conveyance interface. For the purpose of an example only, FIG. 1 depicts a while-drilling interface. However, systems and methods disclosed herein could apply equally to wireline or any other suitable conveyance means. The bottom hole assembly 100 of the illustrated embodiment includes a logging-while-drilling (LWD) module 120, a measuring-while-drilling (MWD) module 130, a roto-steerable system and motor, and drill bit 105.

The LWD module 120 is housed in a special type of drill collar, as is known in the art, and can contain one or a plurality of known types of logging tools. It will also be understood that more than one LWD and/or MWD module can be employed, e.g. as represented at 120A. (References, throughout, to a module at the position of 120 can alternatively mean a module at the position of 120A as well.) The LWD module includes capabilities for measuring, processing, and storing information, as well as for communicating with the surface equipment. In the present embodiment, the LWD module includes a nuclear magnetic resonance measuring device.

The MWD module 130 is also housed in a special type of drill collar, as is known in the art, and can contain one or more devices for measuring characteristics of the drill string and drill bit. The MWD tool further includes an apparatus (not shown) for generating electrical power to the downhole system. This may typically include a mud turbine generator powered by the flow of the drilling fluid, it being understood that other power and/or battery systems may be employed. In the present embodiment, the MWD module includes one or more of the following types of measuring devices: a weight-on-bit measuring device, a torque measuring device, a vibration measuring device, a shock measuring device, a stick slip measuring device, a direction measuring device, and an inclination measuring device.

Figure 2:
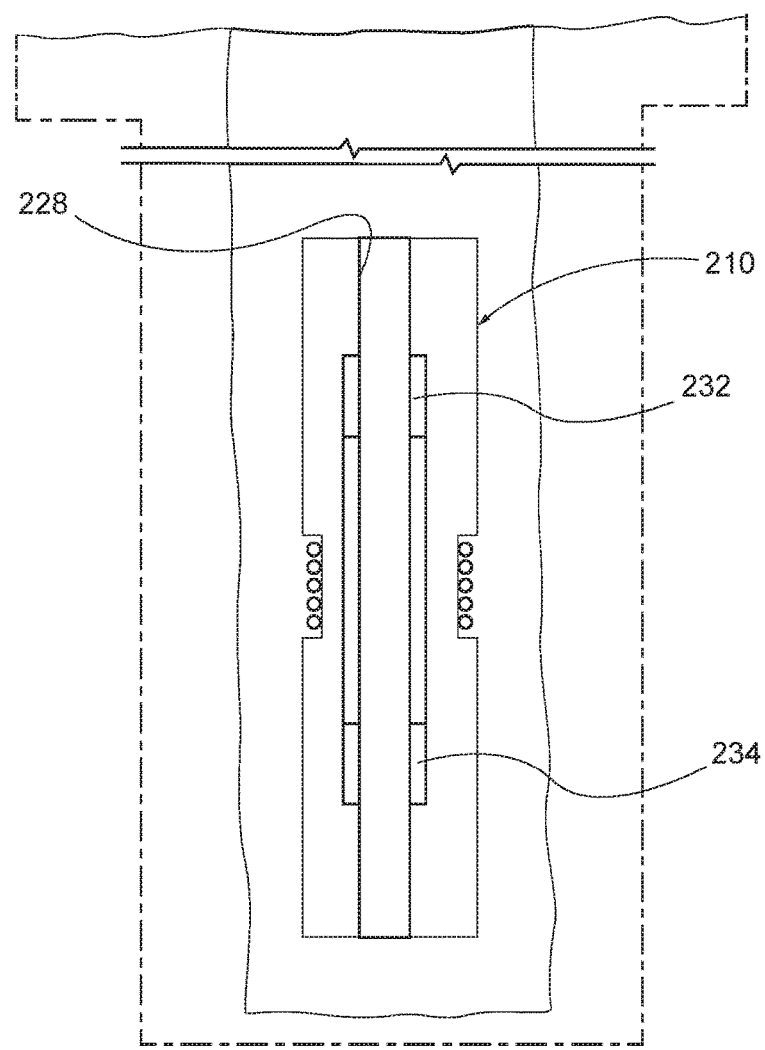
FIG. 2 shows an embodiment of a type of device for formation evaluation while drilling using NMR.

FIG. 2 shows an embodiment of a type of device for formation evaluation while drilling using NMR, it being understood that other types of NMR/LWD tools can also be utilized as the LWD tool 120 or part of an LWD tool suite 120A. Referring to FIG. 2, in an example embodiment of the invention, hereinafter referred to as a low gradient design, magnet array comprises an upper magnet 232 axially separated from a lower magnet 234. The area between magnets 232, 234 is suitable for housing elements such as electronic components, an RF antenna, and other similar items. Both magnets 232, 234 surround sleeve 228.

The magnets 232, 234 can be polarized in a direction parallel to the longitudinal axis of the tool 210 with like magnetic poles facing each other. For each magnet 232, 234, the magnetic lines of induction travel outward from an end of the magnet 232, 234 into the formation to create a static field parallel to the axis of the tool 210 and travel inward to the other end of the magnet 232, 234. In the region between upper magnet 232 and lower magnet 234, the magnetic lines of induction travel from the center outward into the formation, creating a static field in the direction perpendicular to the axis of the tool 210. The magnetic lines of induction then travel inward symmetrically above the upper magnet 232 and below the lower magnet 234 and converge in the longitudinal direction inside sleeve 228.

FIG. 3 is a schematic diagram illustrating magnets 306A, 306B embedded on a drill collar 304, according to an example embodiment. In some embodiments, the magnets 306A, 306B can be similar to the magnets 232, 234 of FIG. 2. In some embodiments, the magnets 306A, 306B can be embedded such that an entire external surface of the magnet 306A, 306B is exposed. As shown in FIG. 3, two magnets 306A, 306B can be embedded on the drill collar 304, axially spaced from each other. An RF antenna 308 also can be placed in the axial space between the two magnets 306A, 306B, to generate the B1 field that is needed to perform NMR. In example embodiments, the drill collar can include recesses to house one or more of the magnets 306A, 306B and the antenna 308. An electronics chassis 302 also can be disposed within the collar 304, and can contact or be proximate to, a flow line 310 (i.e., for mud or other liquids to flow therein) or channel disposed within the collar 304.

A permeable member 312 also can be inserted into the flow line 310, and can be inserted generally axially between the two permanent magnets 306A, 306B. As used herein, the term permeable generally refers to magnetic permeability. In an example embodiment, as shown in FIG. 3, the permeable member 312 can be inserted within the flow line 310 such that the permeable member 312 axially overlaps with each of the permanent magnets 306A, 306B, thereby occupying the entire axial space between the two permanent magnets 306A, 306B. In some embodiments, the permeable member 312 can extend axially from one permanent magnet 306A to the other 306B, but need not overlap with either or both of the permanent magnets 306A, 306B. In another alternative embodiment, the permeable member 312 may not occupy the entire axial space between the two permanent magnets 306A, 306B. In various example embodiments, the permeable member 312 can be made of any material having a non-zero magnetic permeability. For example, this may include 1010 steel or 15_5 stainless steel. Moreover, as shown in FIG. 3, the permeable member 312 can also be axially disposed and/or contact the remainder of the flow line 310, which can be made from a non-magnetically permeable member 312.

In example embodiments, the permeable member 312 can include a permeable mandrel located in the flow line 310 on the inside of the tool that can be used to shape the magnetic field. This mandrel can be split up into many permeable and non-permeable rings that enable the shaping of the magnetic field, Bo, and the magnetic field gradient, g. Certain effects of permeable members 312 on the shape of a generated magnetic field are disclosed in U.S. Pat. No. 6,400,149, the entire disclosure of which is hereby incorporated by reference herein. Additionally, the effect of permeable members 312 and magnet spacing on the magnetic field and the magnetic field gradient will be discussed in more detail below.

FIG. 4 is a schematic diagram illustrating magnets 306A, 306B and an antenna 308 on sleeve 416 disposed on a drill collar 304, according to an example embodiment. In example embodiments, the drill collar 304 can be made of an upper collar 404A and a lower collar 404B. Between the upper 404A and lower 404B collars can be a recess 414 onto which the sleeve 416 can be slid and optionally locked into place. The sleeve 416 can include two permanent magnets 306A, 306B and an antenna 308, each of which can be slid onto the sleeve 416. Additionally, the sleeve 416 can include a permeable member and/or be made of a permeable material that can be similar in composition and function to the permeable member 312 disposed within the flow line 310 in FIG. 3. In some embodiments, a permeable member (not shown) can be included in the flow line 310 as in FIG. 3. By having the magnets 306A, 306B and antenna 308 built as a sleeve 416 that slides over the LWD collar 304, the sleeve 416 can be serviced and replaced separately, instead of the entire collar 304.

Figure 4A:
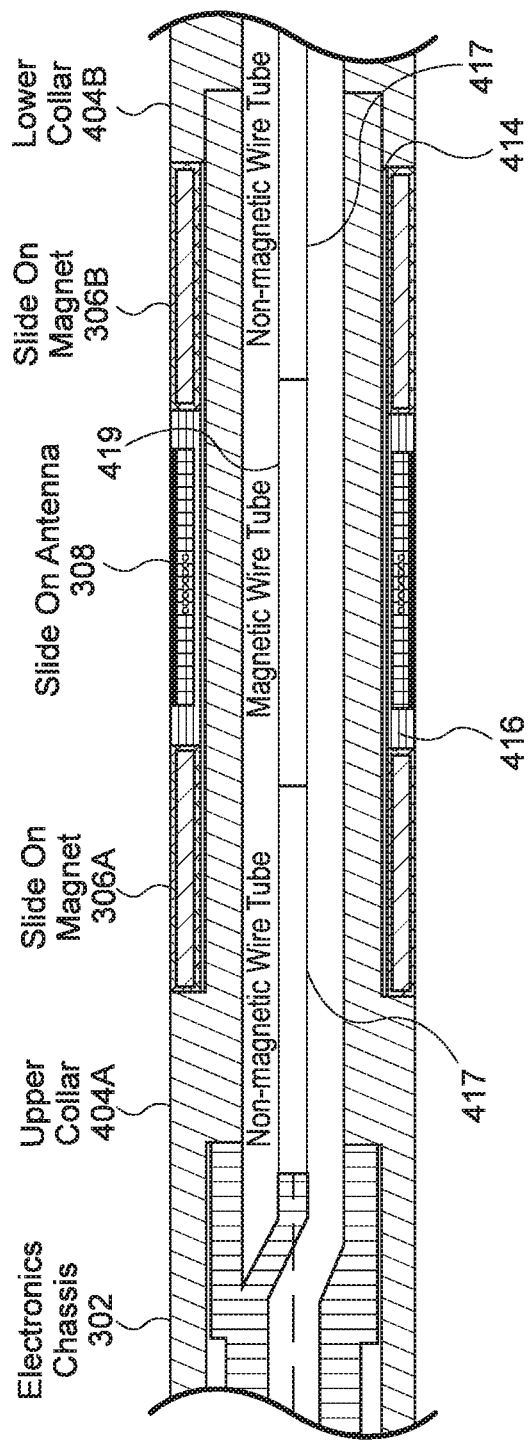
FIG. 4A is a schematic diagram illustrating the magnet assembly of FIG. 4 with the addition of magnetic and non-magnetic pieces in the flow line, according to an example embodiment

FIG. 4A is a schematic diagram illustrating the magnet assembly of FIG. 4 with the addition of magnetic and non-magnetic pieces in the flow line 310, according to an example embodiment. As shown in FIG. 4A, in some embodiments, the flow line 310 can include a combination of magnetic 419 and non-magnetic pieces 417. In various embodiments, a variety of different sections of the flow line 310 can include magnetic pieces 419. The use of magnetic pieces 419 in the flow line 310 can shape the static magnetic field. Magnetic 419 and non-magnetic pieces 417 can be used to make the flow line 310, both for embodiments similar to the embodiment illustrated in FIG. 3 and similar to the embodiment illustrated in FIG. 4, as well as other embodiments consistent with the present disclosure. In some embodiments, the magnetic 419 and non-magnetic pieces 417 can be welded together. Other methods for joining the pieces 417, 419 together can include threading the pieces 417, 419 together, or other suitable methods that may be known to those of skill in the art having benefit of the present disclosure. Using both magnetic and non-magnetic pieces to make the flow line 310 can allow for further magnetic field shaping and/or shimming.

Figure 5:
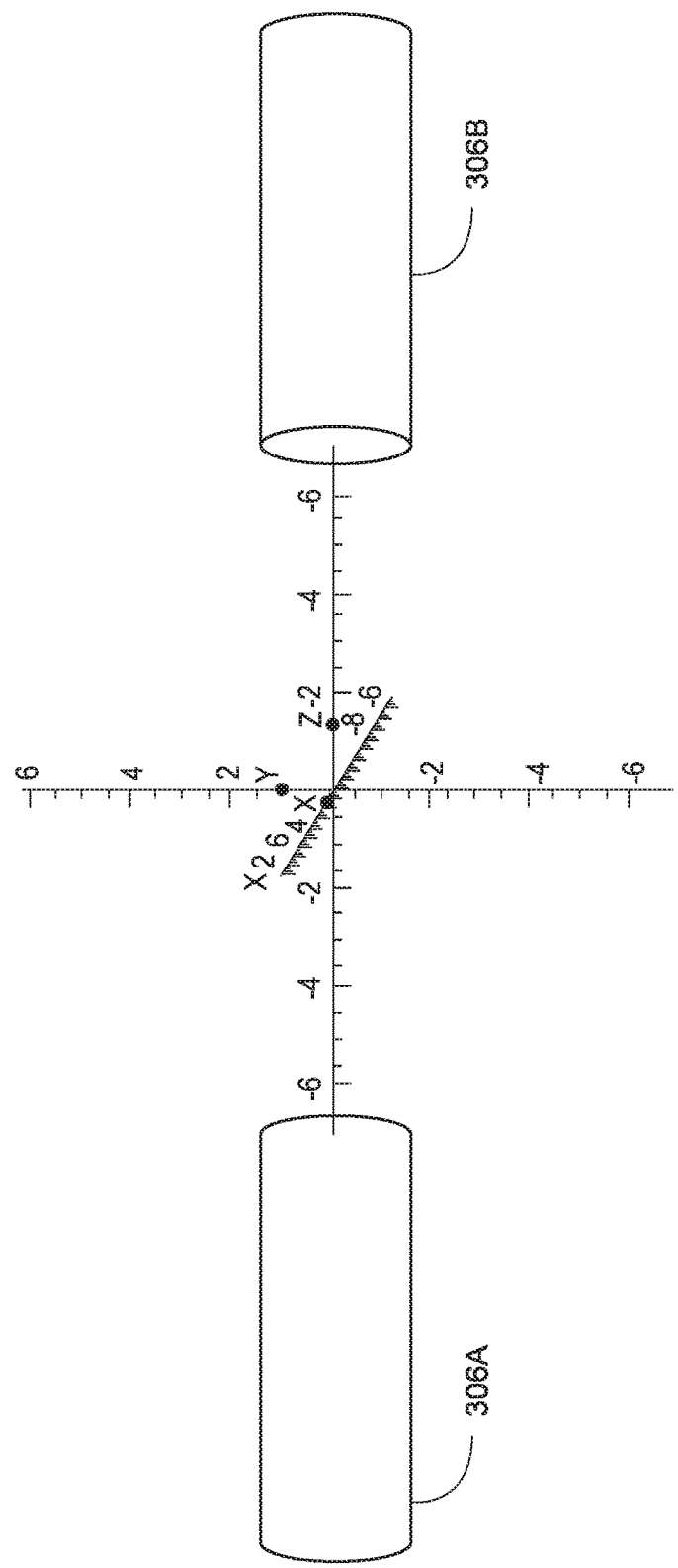
FIG. 5 is a diagram of two magnets reproduced on a set of axes, according to an example embodiment.

FIG. 5 is a diagram of two magnets 306A, 306B reproduced on a set of axes, according to an example embodiment. As shown in FIG. 5, no permeable (soft) magnetic material is disposed between the magnets 306A, 306B. In the illustrated embodiment, the cylinders represent two permanent magnets 306A, 306B with their similar magnetic poles facing each other.

Figure 6:
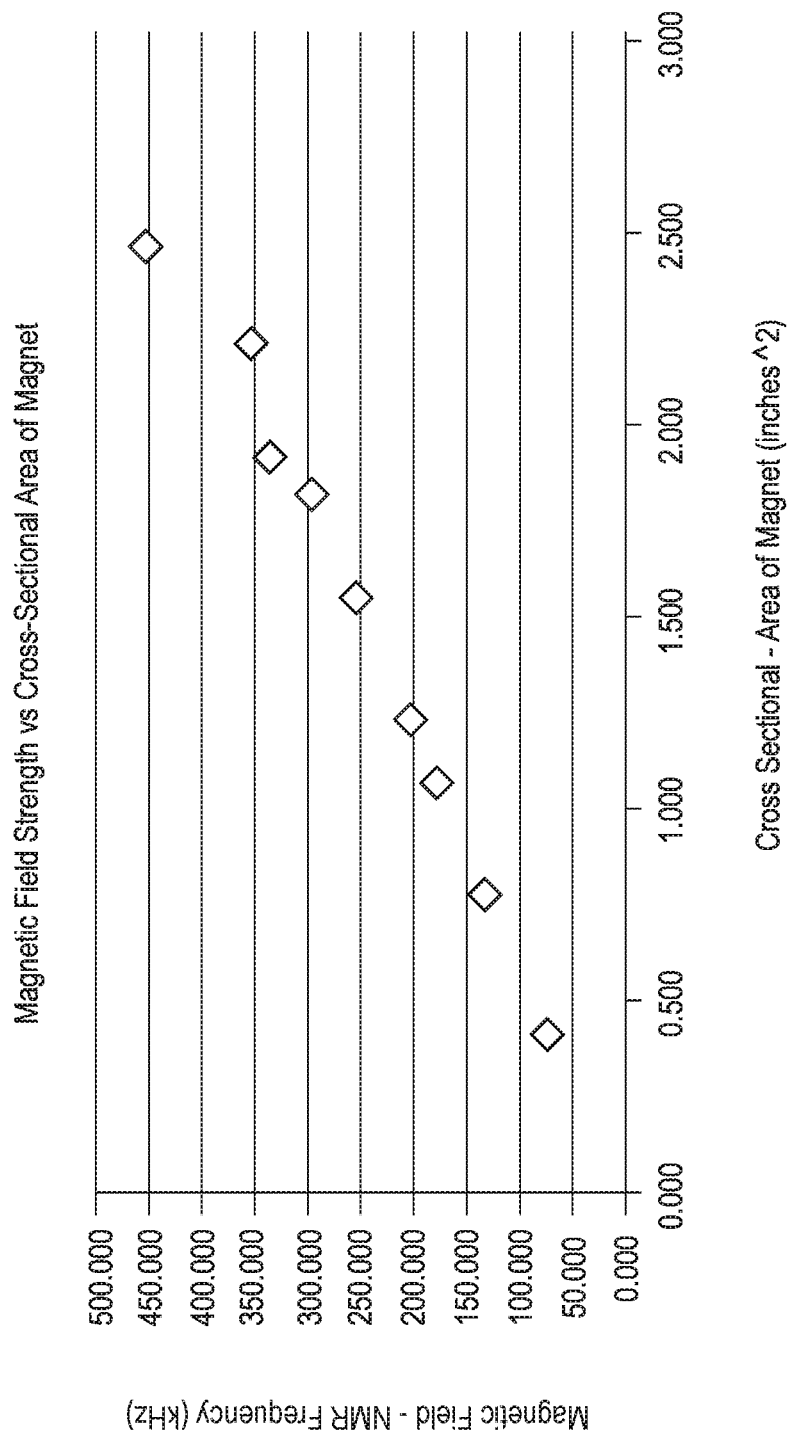
FIG. 6 is a chart illustrating an effect of magnet cross section (and by inference, volume) on the magnetic field strength, according to an example embodiment.

Whether there is a permeable member 312 disposed between the magnets 306A, 306B or not, the field and field gradient created by the two magnets 306A, 306B can change as a function of magnet spacing and volume as shown in FIGS. 4-6. In some embodiments, the field can change in a similar way for the volume of the magnet material with a fixed distance between the magnets 306A, 306B. This type of magnet assembly is often used in LWD NMR tools.

FIG. 6 is a chart illustrating an effect of magnet cross section (and by inference, volume) on the magnetic field strength, according to an example embodiment. The chart illustrates magnetic field strength at a depth of investigation located outside of the tool (e.g., at a bisector of magnets, located radially some distance from the longitudinal axis of the magnet assembly). This chart shows the drastic improvement that can be obtained in NMR operating frequency for a fixed magnet spacing and fixed depth of investigation if the cross-sectional area of the magnets (and therefore volume) is increased.

Figure 7:
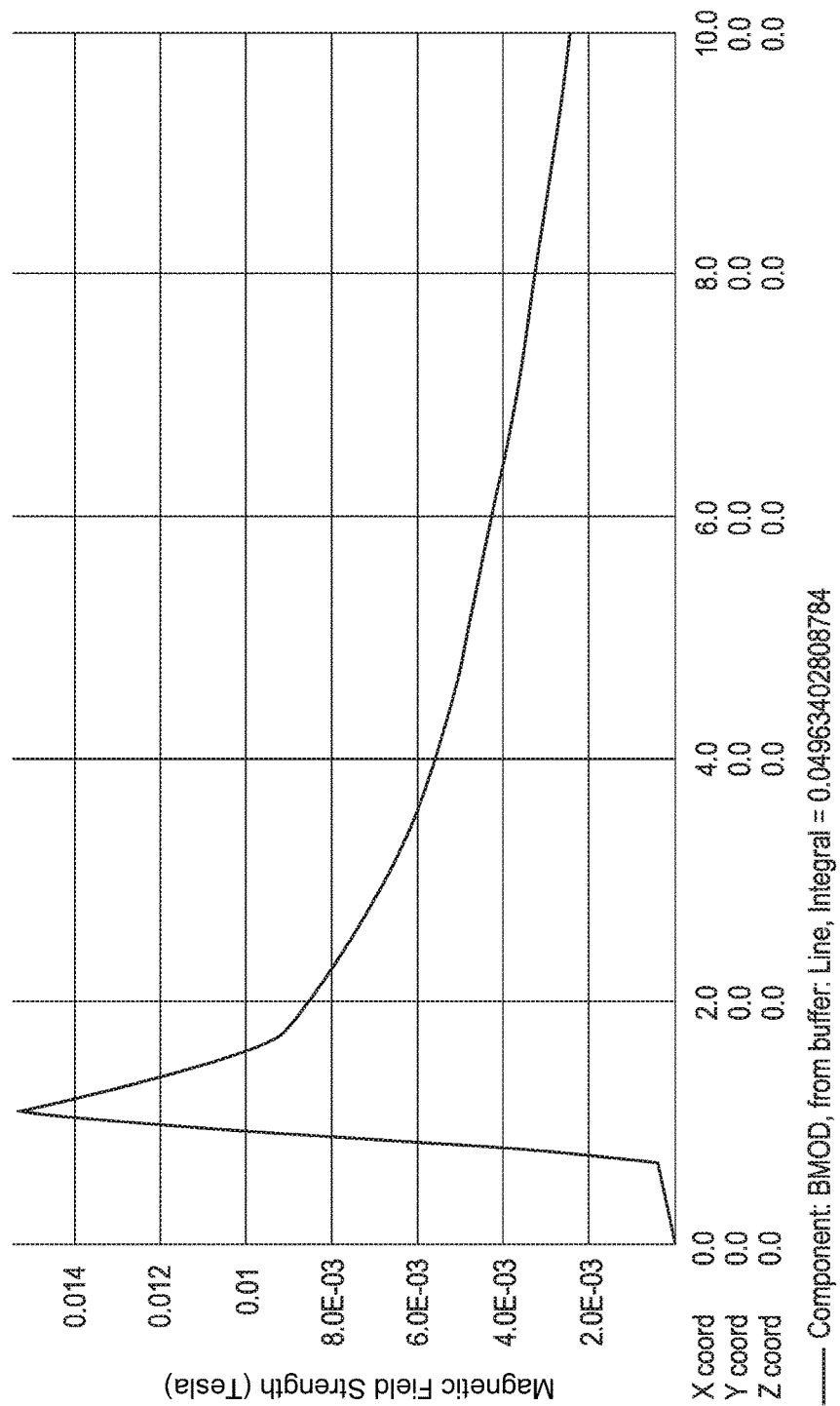
FIG. 7 is a chart illustrating the field profile along the radial direction of the magnet assembly of FIG. 5, according to an example embodiment.

FIG. 7 is a chart illustrating the field profile along the radial direction of the magnet assembly of FIG. 5, according to an example embodiment. In other words, the chart illustrates the field profile Bo along radial direction from the center of the mandrel. This can be called a gradient field design. This line is from the center of the space between to the two magnets 306A, 306B, extending out orthogonal to the long axis of the magnets 306A, 306B. The center of the magnets 306A, 306B in the logging device is at x=0". The field increases to a maximum at a point located at 1" from the center line of the tool and then decreases as a function of distance from the logging device.

There are multiple types of magnetic field configurations that can be created. One example type is a gradient field design, an example of which is shown in FIG. 7, as the design has a decaying field outside of the tool. Another example configuration is a saddle point type. In some embodiments, a saddle point field configuration can be defined by having a maximum field strength at a point outside of the tool containing the magnets 306A, 306B, which then decays at farther or shorter distances from the tool center. Regardless of the particular configuration, the rate of decay at each point is often referred to as the magnetic field gradient.

The magnetic field gradient is a concept used in several applications of downhole NMR. For example, the gradient can be used to obtain molecular diffusion measurements (which can be used, for example, for fluid typing) and it is also related to the maximum excitable shell thickness and subsequent motion effects. In LWD NMR particularly, there can be significant lateral motion of the tool during drilling process. This movement can move the NMR receiving slice (the spatial region that contributes to NMR signal reception) out of the NMR excitation slice (the spatial region that the RF pulses excite NMR spin dynamics and generating the NMR signal). When the receiving and excitation slices move relative to each during the time of excitation and reception, the NMR signal may exhibit decay due to such motion. For a particular magnitude of the movement, the amount of corresponding decay is proportional to the overlap of the reception slice and the excitation slice. Thus the decay will be small when the slice area is much larger than the amount of the movement. The size of the receiving slice compared to the excited slice is fundamentally important in motion considerations. Accordingly, in some uses and some embodiments, it can be desirable to have a large excitation and reception slice compared to the expected tool motion.

A low gradient can decrease the sensitivity to motion. As an example, if an excitation field of 1 G is used at a given DOI, and the gradient is 1 G/cm, then a 1 cm thick shell is excited. If the gradient is 10 G/cm, then a 0.1 cm thick shell is excited.

Diffusion editing is a technique used to differentiate fluids with the same T2 or T1 values. Different hydrocarbon chain lengths generally diffuse at different rates. This measurement can be accomplished by using a magnetic field gradient to increase the attenuation of the signal by diffusion effects. By applying a T90-T180 pulse sequence before a CPMG, the time that the spins have to diffuse can be varied. In addition to this initial echo time (Te), the diffusion can be strongly influenced by the gradient strength. The larger the gradient, the larger the diffusion effect generally is, in some embodiments. By changing the initial echo encoding times, a D-T2 or D-T1 map (T1 or T2 are from the CPMG data after the diffusion encoding step, and D represents diffusion) can be created. The loss of signal from diffusion scales are $te^3$ and $G^2$ (where G is the gradient). Thus, the larger the gradient, the shorter the encoding time needs to be. This results in a more robust measurement to motion effects.

For a LWD porosity measurement it can be beneficial to have a low gradient so as to increase the sensitive region. However, when trying to perform a diffusion editing measurement, a higher gradient can be beneficial, as it would generally enable the reduction of measurement times. Thus, an example system that can be changed to move from being a low to high gradient dependent on the measurement objective can be very beneficial to a downhole NMR logging tool.

Magnetic field shaping also can be done by changing magnet spacing. If the spacing between the magnets 306A, 306B is changed, both the magnetic field and the magnetic field gradients will change at a depth of investigation (DOI).

Figure 8:
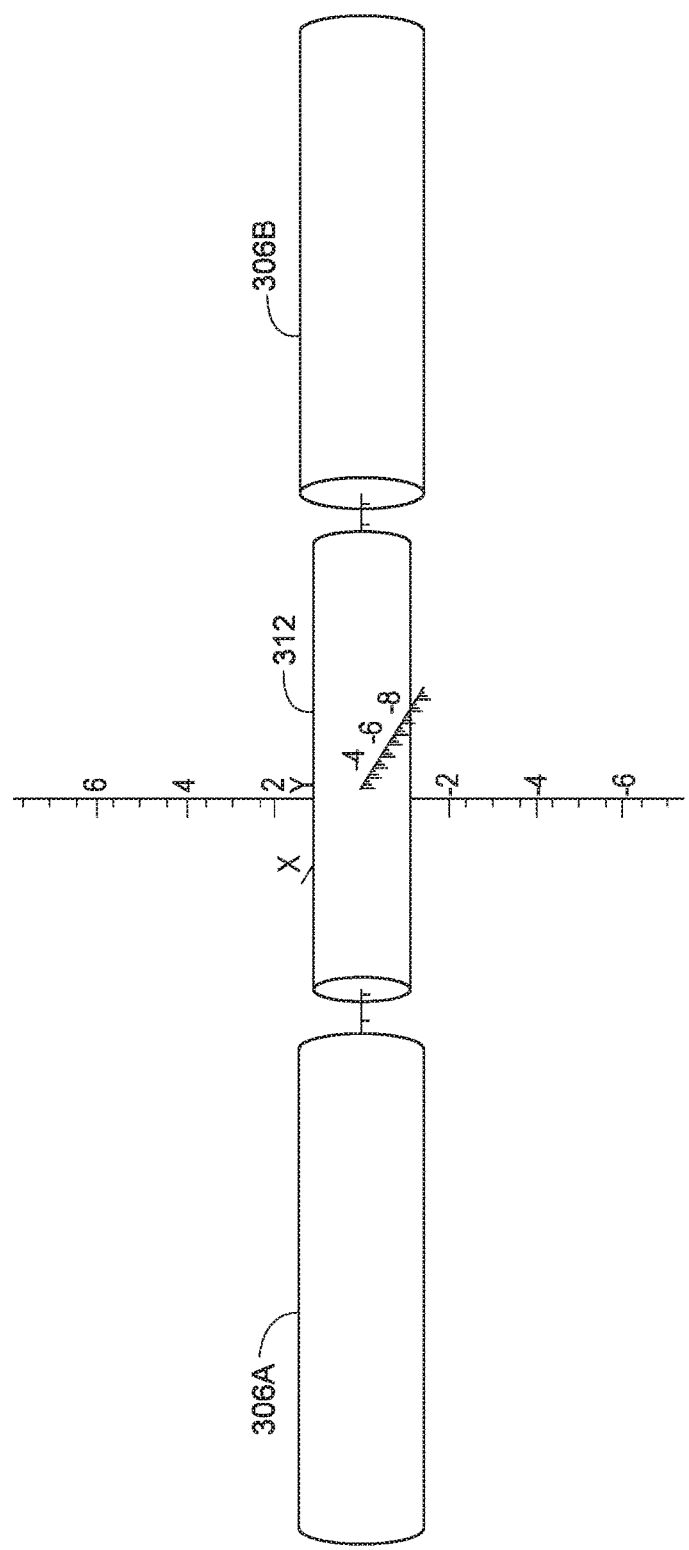
FIG. 8 illustrates a magnetically permeable member disposed between two magnets, according to an example embodiment.

FIG. 8 illustrates a magnetically permeable member 312 disposed between two magnets 306A, 306B, according to an example embodiment. The embodiment of FIG. 8 is one example of a method to increase the magnetic field strength at the depth of investigation—i.e., to insert a magnetically permeable member 312 with high permeability (such as 50) between the two permanent magnets 306A, 306B. In an example embodiment, this permeable member 312 guides the magnetic flux from the magnets 306A, 306B into the element piece and then pushes the magnetic field out radially around the center of the element, thus increasing the magnetic field. At the same time, the magnetically permeable member 312 increases the magnetic field gradient. In example embodiments, such as in FIG. 8, the permeable member 312 can be a solid permeable mandrel disposed axially between the two magnets 306A, 306B.

FIG. 9A illustrates a magnetically permeable member 312 split into rings 912A-C disposed between two magnets 306A, 306B, according to an example embodiment. As shown in FIG. 9A, the magnetically permeable member 312 is split into three rings 912A-C, with the middle ring 912A being longer than the outer two rings 912B, 912C of equal side. In various embodiments, a variety of other arrangement are possible (e.g., split into any number of rings 912, the rings 912 having a variety of sizes or uniform sizes, etc.) This permeable member 312 can be further split up into smaller rings 912 in order to change the magnetic field profile. These rings 912A-C can also be moved axially, and doing so can further change the magnetic field configuration (e.g. magnetic field strength and field gradients). By changing the distribution of the magnetic material, the magnetic field and the magnetic field gradient are changed, as the magnetic field and gradient depend at least partially upon the distribution of magnetic material.

Figure 9B:
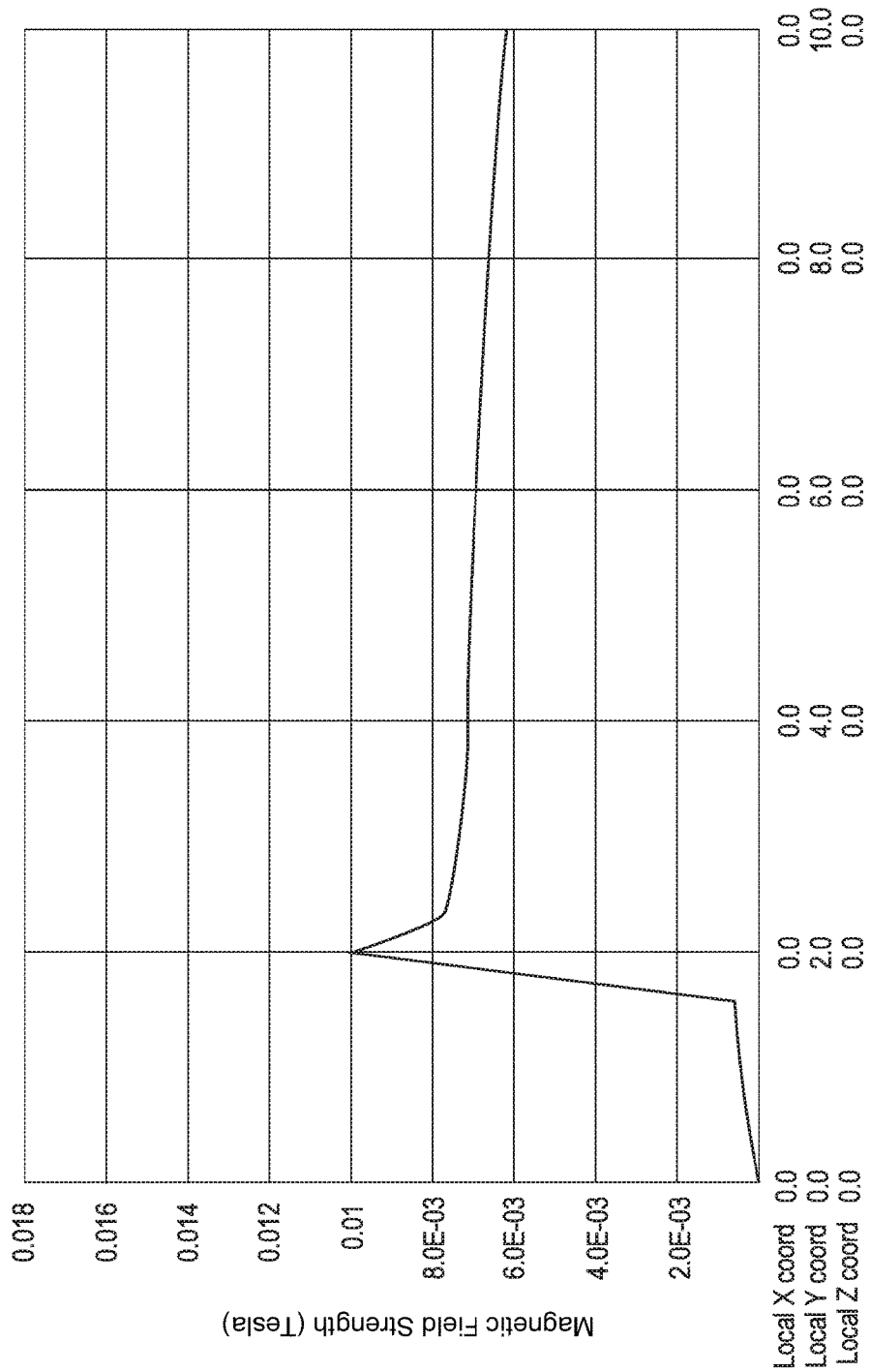
FIG. 9B is a chart illustrating the magnetic field profile along the radial direction of the magnet assembly of FIG. 9A, according to an example embodiment.

FIG. 9B is a chart illustrating the magnetic field profile along the radial direction of the magnet assembly of FIG. 9A, according to an example embodiment. FIG. 9C is a chart illustrating magnetic isopotential lines 918 of the magnet assembly of FIG. 9A, according to an example embodiment.

Figure 10A:
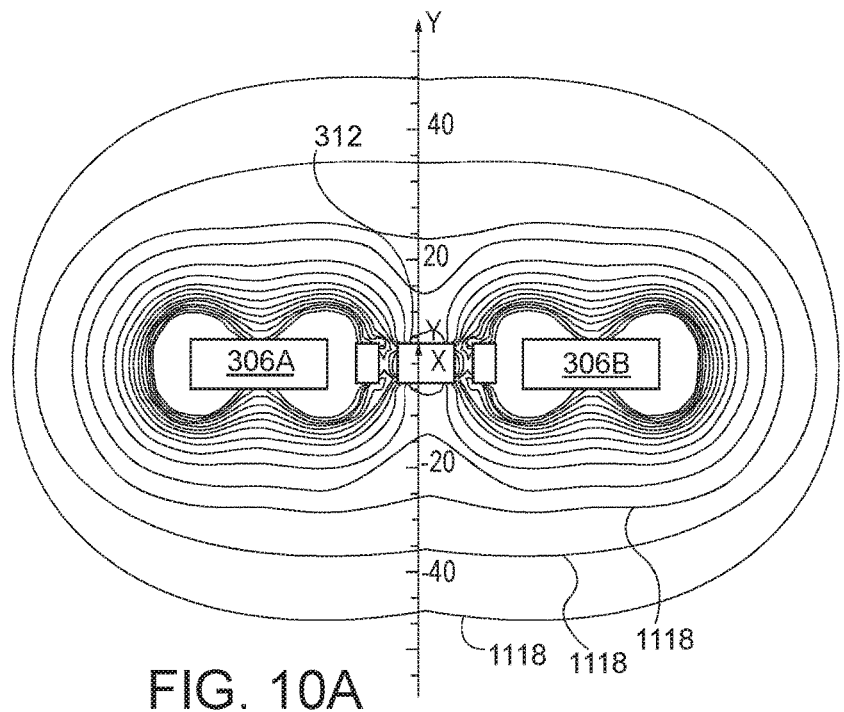
FIG. 10A is a chart illustrating magnetic isopotential lines of an illustrated magnet assembly with a permeable member, according to an example embodiment.
Figure 10B:
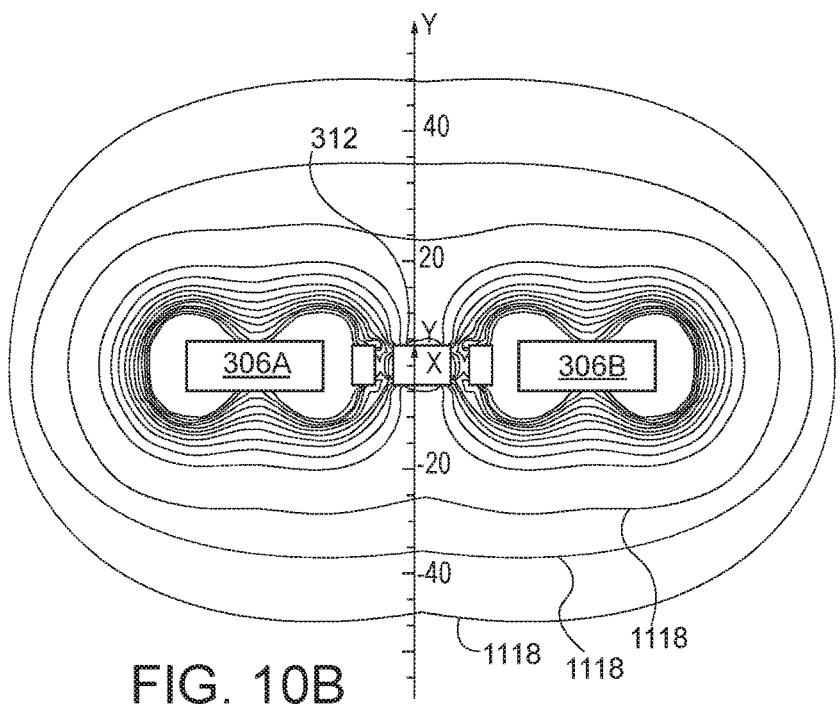
FIG. 10B is a chart illustrating magnetic isopotential lines of another illustrated magnet assembly with a permeable member shorter than that of FIG. 10A, according to an example embodiment.
Figure 10C:
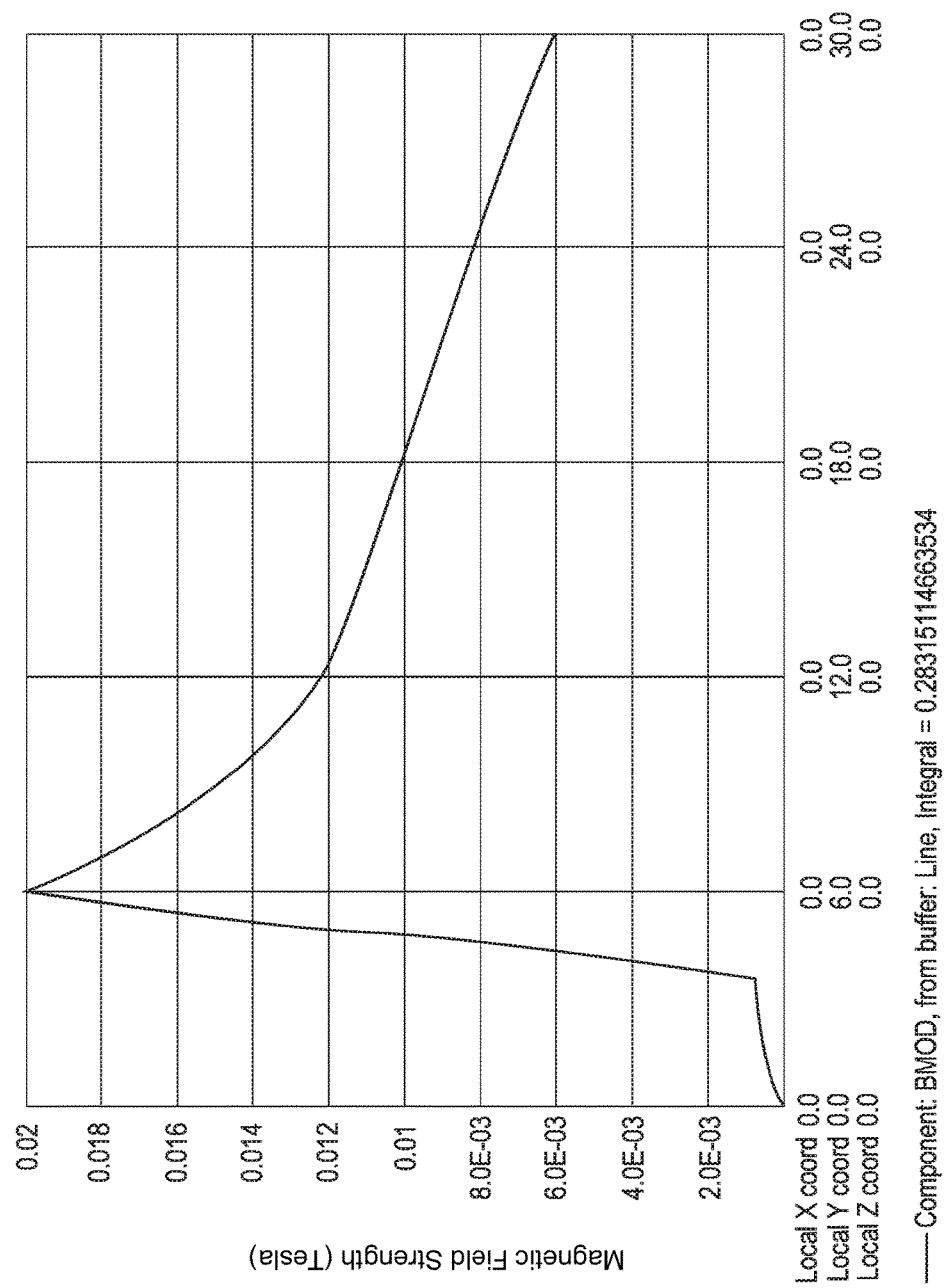
FIG. 10C is a chart illustrating the magnetic field profile of the magnet assembly shown in FIG. 10A.
Figure 10D:
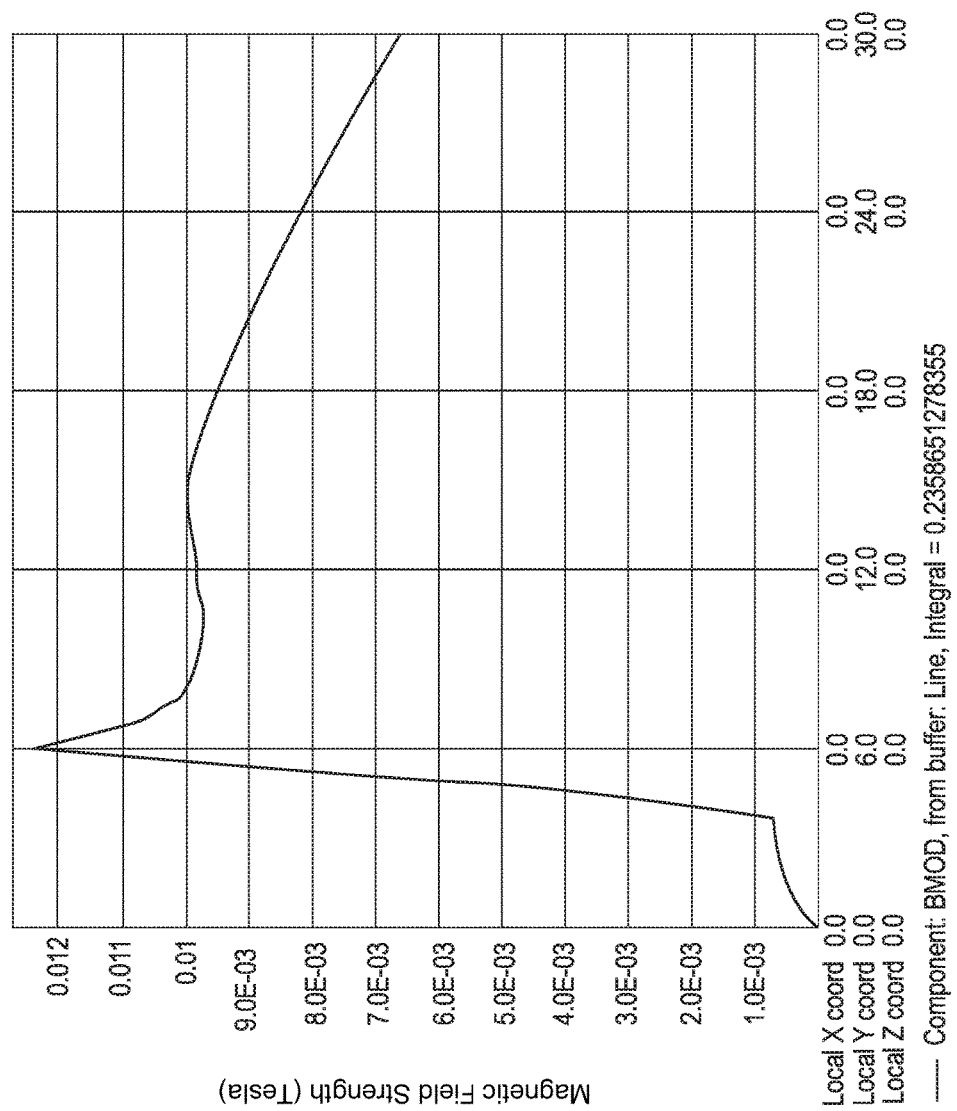
FIG. 10D is a chart illustrating the magnetic field profile of the magnet assembly shown in FIG. 10B.

FIGS. 10A-D illustrate other examples of the effect of changing the size of the permeable member 312 on the magnetic field. FIG. 10A is a chart illustrating magnetic isopotential lines 1118 of an illustrated magnet assembly with a permeable member 312, according to an example embodiment. FIG. 10B is a chart illustrating magnetic isopotential 1118 lines of another illustrated magnet assembly with a permeable member 312 shorter than that of FIG. 10A. FIGS. 10A and 11B are based on a magnet spacing of 40 cm, with FIG. 10A being based on a SW of 20 cm and FIG. 10B being based on an SW of 20 cm. FIG. 10C is a chart illustrating the magnetic field profile of the magnet assembly shown in FIG. 10A. FIG. 10D is a chart illustrating the magnetic field profile of the magnet assembly shown in FIG. 10B.

By examining FIGS. 10A-D, it can be seen that if the permeable pieces are decreased in size with a fixed magnet spacing, the field profile and gradient change. There is a point at which the design moves from being a gradient tool into being a saddle point design. In example embodiments, to change the permeable pieces that sit between the two magnets 306A, 306B, magnetic and non-magnetic pieces can be welded together to create an insert to the flow line 310. This piece can be interchangeable with other similar pieces that are configured to produce a desired magnetic field and magnetic field gradient.

Although specific embodiments of the invention have been described above in detail, the description is merely for purposes of illustration. Various modifications of, and equivalent steps corresponding to, the disclosed aspects of the example embodiments, in addition to those described above, can be made by those skilled in the art without departing from the spirit and scope of the invention defined in the following claims, the scope of which is to be accorded the broadest interpretation so as to encompass such modifications and equivalent structures.

What is claimed is:

1. A nuclear magnetic resonance apparatus comprising:
   a drill collar with a flow line;
   a first magnet embedded in the drill collar;
   a second magnet axially separated from the first magnet;
   a magnetically permeable member split into three rings wherein the member is disposed within the flow line and wherein the member is positioned between the first magnet and the second magnet; and
   an antenna disposed between the first magnet and second magnet.

2. The apparatus of claim 1, wherein the permeable member comprises a magnetic material.

3. The apparatus of claim 2, wherein the permeable member further comprises a non-magnetic material.

4. The apparatus of claim 1, wherein the permeable member comprises a magnetic material to shape a static magnetic field generated by the apparatus.

5. A nuclear magnetic resonance apparatus comprising:
   a drill collar having a recess;
   a sleeve configured to slide onto the recess;
   a first magnet disposed on the sleeve;
   a second magnet disposed on the sleeve; and
   a magnetically permeable member split into three rings wherein the member is disposed within the flow line and wherein the member is positioned between the first magnet and the second magnet; and
   an antenna disposed between the first magnet and second magnet.

6. The apparatus of claim 5, wherein the flow line is disposed within the drill collar.

7. The apparatus of claim 5, wherein at least a portion of the permeable member is positioned axially between the first magnet and second magnet.

8. The apparatus of claim 7, wherein the flow line comprises a magnetic material to shape a static magnetic field generated by the apparatus.

* * * * *